(12) United States Patent
Taniguchi et al.

(10) Patent No.: US 7,102,462 B2
(45) Date of Patent: Sep. 5, 2006

(54) SURFACE ACOUSTIC WAVE DEVICE

(75) Inventors: Noriaki Taniguchi, Kanagawa (JP);
Osamu Furukawa, Kanagawa (JP);
Toshihiko Murata, Kanagawa (JP);
Osamu Kawachi, Kanagawa (JP)

(73) Assignee: Fujitsu Media Devices Limited, Yokohama (JP)

( * ) Notice: Subject to any disclaimer, the term of this patent is extended or adjusted under 35 U.S.C. 154(b) by 58 days.

(21) Appl. No.: 11/024,769

(22) Filed: Dec. 30, 2004

(65) Prior Publication Data

US 2006/0022767 A1 Feb. 2, 2006

(30) Foreign Application Priority Data

Aug. 1, 2004 (JP) .............................. 2004-002927

(51) Int. Cl.
*H03H 9/25* (2006.01)
*H01L 41/083* (2006.01)

(52) U.S. Cl. .................. 333/133; 333/195; 310/313 R; 310/340

(58) Field of Classification Search ................ 333/133, 333/193, 195; 310/313 R, 340
See application file for complete search history.

(56) References Cited

U.S. PATENT DOCUMENTS 5,499,002 A 3/1996 Kinsman

| | | | |
|---|---|---|---|
| 5,932,950 A | * | 8/1999 | Yamada et al. .......... 310/313 D |
| 2004/0004266 A1 | | 1/2004 | Furumiya et al. |
| 2005/0116352 A1 | * | 6/2005 | Warashina et al. .......... 257/777 |
| 2006/0066419 A1 | * | 3/2006 | Iwaki et al. ................. 333/133 |

FOREIGN PATENT DOCUMENTS

| | | |
|---|---|---|
| FR | 2 841 381 A1 | 12/2003 |
| JP | 8-32402 | 2/1996 |
| JP | 10-126213 | 5/1998 |
| JP | 2001-127588 | 5/2001 |

* cited by examiner

*Primary Examiner*—Dean Takaoka
(74) *Attorney, Agent, or Firm*—Arent Fox PLLC

(57) ABSTRACT

The present invention permits further miniaturization and shortening of a surface acoustic wave device while avoiding the influence of the surface acoustic wave device on the inductance value and performance index (Q value) of the spiral inductor. The chip on which the spiral inductor is formed is flip-chip mounted in a package together with another surface acoustic wave device chip. The package is provided with a hermetically sealed lid. A conductor pattern is formed on a face of the package that opposes the spiral inductor. Further, the overlap between the region of the spiral inductor and the conductor pattern is 7% or less.

6 Claims, 17 Drawing Sheets

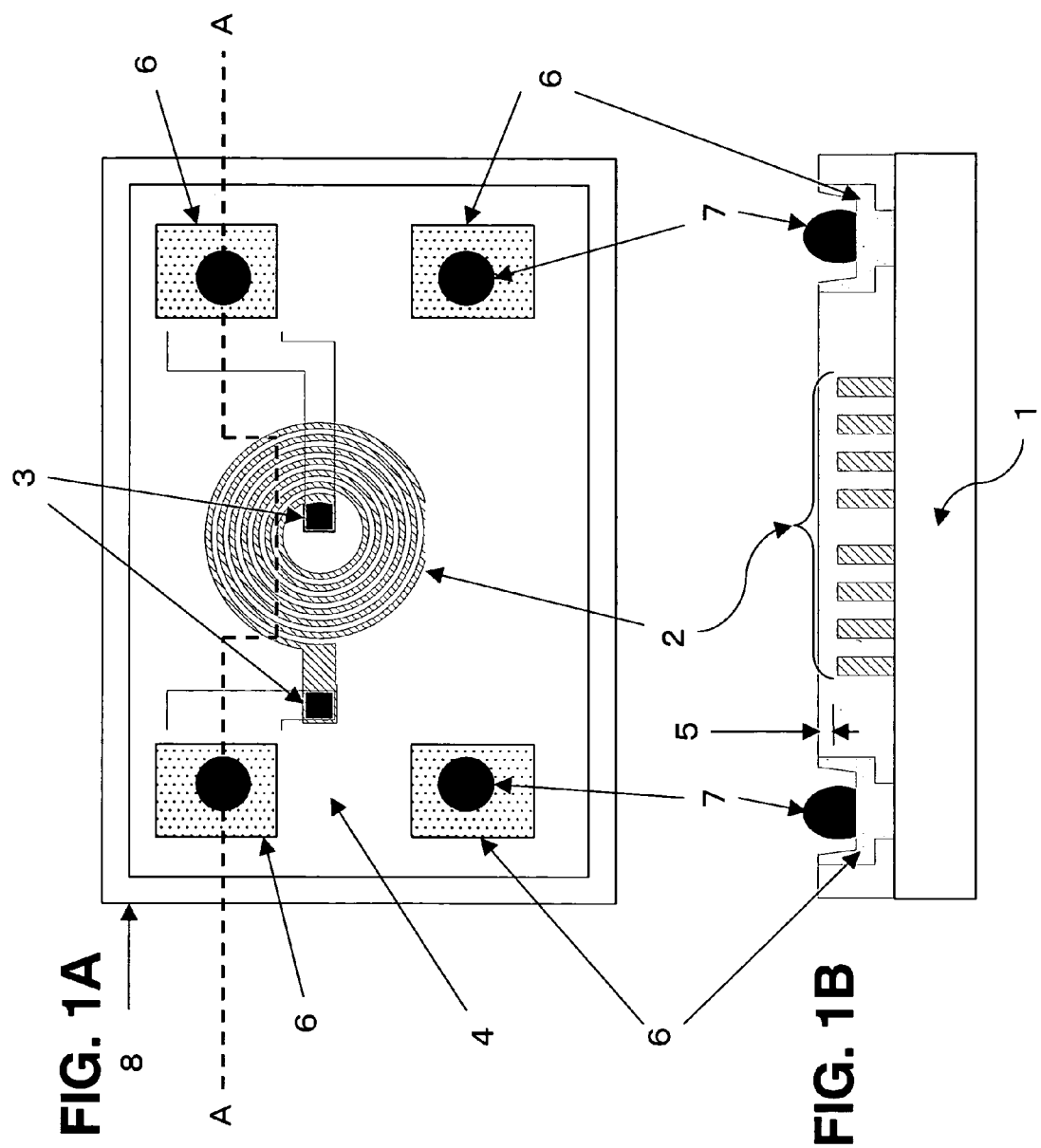

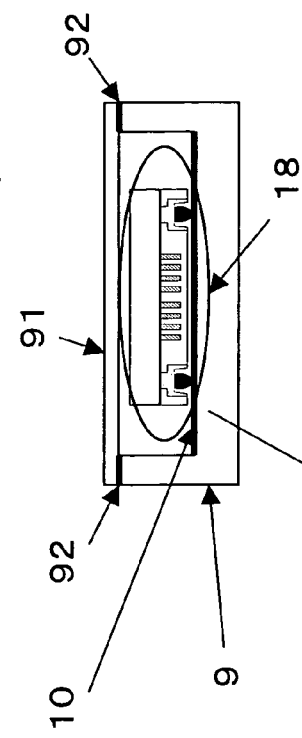
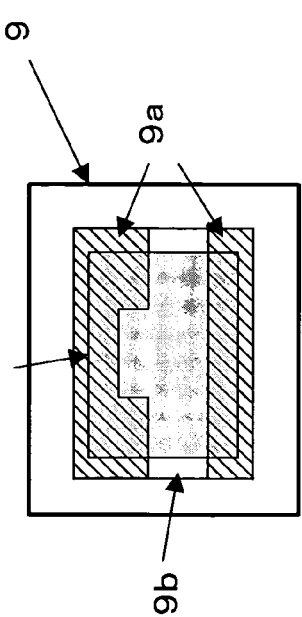
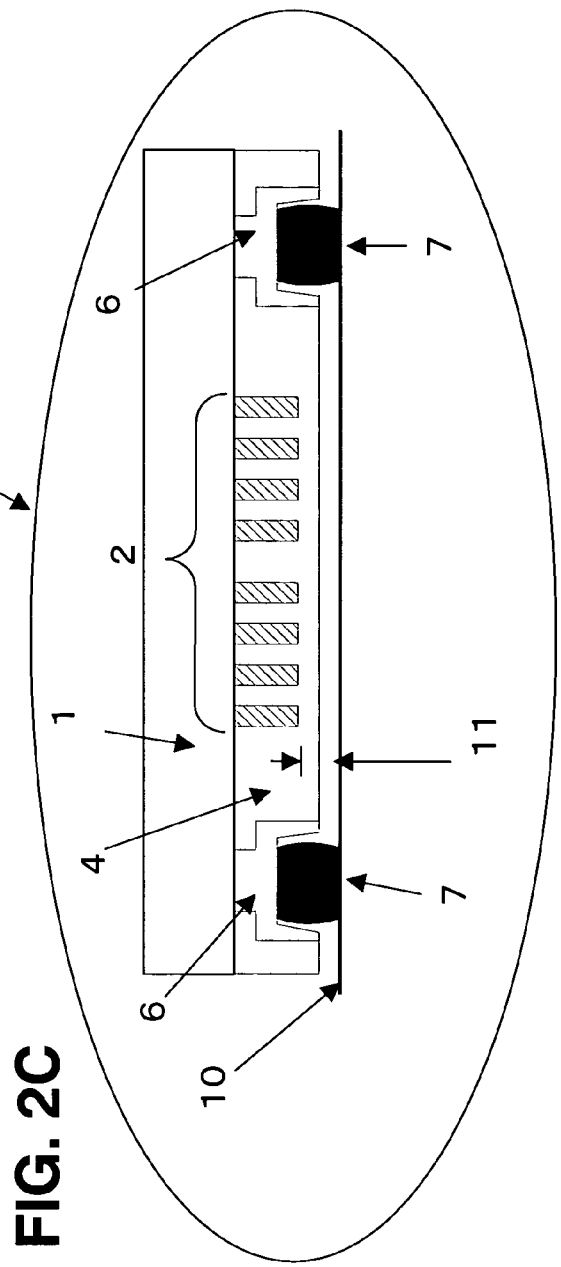

SURFACE ACOUSTIC WAVE DEVICE

BACKGROUND OF THE INVENTION

1. Field of the Invention

The present invention relates to a surface acoustic wave device that comprises a chip on which a spiral inductor is formed.

2. Description of the Related Art

A surface acoustic wave device is employed in high-frequency circuit components of cellular phones or other miniature wireless devices, such as in splitters (duplexers) that are connected to a transmission/reception common antenna, for example. In this case, a surface acoustic wave device is constituted such that a SAW filter, which uses a surface acoustic wave element, and a phase shift circuit for separating the transmission and reception frequency bands or a phase matching circuit are mounted in a common package for the sake of miniaturization.

Proposals for further miniaturizing and shortening the height of such a surface acoustic wave device and a variety of proposals for enhancing the characteristics of the phase shift circuit or phase matching circuit to be used in the splitter have been made (Japanese Patent Application Laid Open Nos. H10-126213, 2001-127588, and H8-32402, for example).

The invention that appears in Japanese Patent Application Laid Open No. H10-126213 forms a phase matching circuit in a multilayered structure and implements miniaturization of the splitter by means of a SAW filter cavity structure that is mounted on the multilayered structure. Further, the invention in Japanese Patent Application Laid Open No. 2001-127588 proposes a structure in which an integrated circuit element is mounted on an upper substrate on the opposite side to the base substrate that does not meet the demands to facilitate fabrication and afford additional miniaturization and shortening of conventional structures in which two transmission/reception filters and an integrated circuit element that constitutes a peripheral circuit such as a phase matching circuit are commonly disposed on a base substrate.

In addition, the invention that appears in Japanese Patent Application Laid Open No. H8-32402 provides a solution for the occurrence of a characteristic variation that is caused by a parasitic capacitance produced between the surface of a matching inductance substrate and the lid of the package and for the generation of loss deterioration in a structure in which the surface acoustic wave element and matching inductance are stored in the same package. Therefore, the parasitic capacitance is suppressed by separating the mounted lid and the surface of the matching inductance substrate housed in the package by a distance of 0.5 mm or more.

In the process of examining additional miniaturization and shortening of a surface acoustic wave device that comprises a chip on which a spiral inductor is formed, the present inventors discovered that, in the case of a constitution in which a chip on which a spiral inductor is formed is flip-chip mounted on a cavity substrate face, the influence on the inductance value and performance index (Q value) of the spiral inductor of the distance of the metal (conductor) pattern disposed on the cavity-substrate face facing the spiral inductor and the amount of overlap of the metal (conductor) pattern and therefore discovered a specific distance for the metal (conductor) pattern disposed on the cavity substrate face and a specific amount for the overlap with the metal (conductor) pattern in order to obtain the preferred characteristics.

SUMMARY OF THE INVENTION

Therefore, an object of the present invention is to provide a surface acoustic wave device with a hermetic structure in which insertion loss is improved without deterioration of the characteristics when shortening is performed, on the basis of these discovered facts. Here, in the description of the present invention, a hermetic structure signifies a hermetically sealed structure.

A surface acoustic wave device that achieves the object of the present invention is, according to a first aspect, a surface acoustic wave device having a chip on which a spiral inductor is formed, wherein the chip on which the spiral inductor is formed is flip-chip mounted in a package together with another surface acoustic wave device chip; the package is provided with a hermetically sealed lid; a conductor pattern is formed on a face of the package that opposes the spiral inductor; and the overlap between the region of the spiral inductor and the conductor pattern is 7% or less.

A surface acoustic wave device that achieves the object of the present invention is, according to a second aspect, a surface acoustic wave device having a chip on which a spiral inductor is formed, wherein the chip on which the spiral inductor is formed is flip-chip mounted in a package together with another surface acoustic wave device chip; the package is provided with a hermetically sealed lid; a conductor pattern is formed on a face of the package that opposes the spiral inductor; and the gap between the spiral inductor and the conductor pattern is at least four or more times the wire width of the spiral inductor.

A surface acoustic wave device that achieves the object of the present invention is, according to a third aspect, a surface acoustic wave device according to aspect 1 or 2, wherein the surface acoustic wave device comprises two surface acoustic wave elements, one of which is a reception surface acoustic wave filter that passes a reception signal that is received from a common antenna, and the other is a transmission surface acoustic wave filter that passes a transmission signal that is supplied to the common antenna; and the chip on which the spiral inductor is formed has a capacitor formed in parallel with the spiral inductor and possesses the function of a phase shift circuit connected to the input side of the reception surface acoustic wave filter.

A surface acoustic wave device that achieves the object of the present invention is, according to a fourth aspect, a surface acoustic wave device according to aspect 3, wherein the conductor pattern on the face opposing the spiral inductor is a conductor for a connection with the reception surface acoustic wave filter, and a ground conductor.

A surface acoustic wave device that achieves the object of the present invention is, according to a fifth aspect, a surface acoustic wave device having a chip on which a spiral inductor is formed, comprising a first chip in which the spiral inductor is formed on an insulator substrate; and a second chip on which a surface acoustic wave device chip is formed, wherein the second chip is flip-chip mounted on the first chip so that the spiral inductor and the surface acoustic wave device chip lie opposite each other; the edges of the first chip and second chip are sealed by means of a hermetic structure; and the region of the spiral inductor and the region of the opposing surface acoustic wave device chip are formed without overlap.

A surface acoustic wave device that achieves the object of the present invention is, according to a sixth aspect, a surface acoustic wave device, wherein the surface acoustic wave device chip comprises two surface acoustic wave elements, one of which is a reception surface acoustic wave filter that passes a reception signal that is received from a common antenna, and the other is a transmission surface acoustic wave filter that passes a transmission signal that is supplied to the common antenna; and the chip on which the spiral inductor is formed has a capacitor formed in parallel with the spiral inductor and possesses the function of a phase shift circuit connected to the input side of the reception surface acoustic wave filter.

The characteristics of the present invention will become more evident from the embodiments of the invention that are described hereinbelow with reference to the drawings.

As a result of the present invention, it is possible to avoid the influence on the inductance value and performance index (Q value) of the spiral inductor of the distance of the metal (conductor) pattern that is disposed on a cavity substrate face facing the spiral inductor and the amount of overlap with the metal (conductor) pattern. As a result, further miniaturization and shortening of the surface acoustic wave device are possible.

BRIEF DESCRIPTION OF THE DRAWINGS

FIG. 1 shows a chip on which only an inductor is mounted in order to illustrate the fundamental principles of the present invention;

FIG. 2 illustrates a constitution in which a chip 8, on which only the spiral inductor 2 shown in FIG. 1 is mounted, is flip-chip mounted in a package;

DESCRIPTION OF THE PREFERRED EMBODIMENTS

Figure 3B:
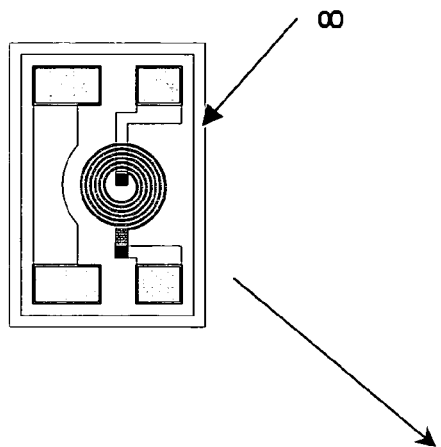
FIG. 3 shows the face opposing the spiral inductor 2.

The embodiments of the present invention will be described hereinbelow with reference to the drawings. Further, the embodiments described hereinbelow permit an understanding of the present invention but the technological scope of the present invention is not limited to these embodiments.

Here, prior to the description of the embodiments, facts discovered by the present inventors, which constitute the fundamental principles of the present invention, will first be described.

FIG. 1 shows a chip on which only an inductor is mounted in order to illustrate the fundamental principles of the present invention. FIG. 1A is a planar view of a chip on which only a spiral inductor 2 is mounted, and FIG. 1B is a side cross-sectional view along the line A—A.

In the case of the chip 8 in FIG. 1, a spiral inductor 2 is formed, by means of copper wiring that has an internal diameter of 0.225, a wire width of 0.01 mm, a wire gap of 0.01 mm and 4.5 turns, on an insulator substrate 1 that consists of a glass substrate or of a silicon substrate covered by an insulating film of silicon oxide film. The chip 8 comprises signal pickups 3 outside the spiral and at the center thereof respectively.

The circumference of the spiral inductor 2 is buried by an insulator 4 with a relative permittivity of 2.8 and a cover 5 of 0.001 mm is formed at the top of the spiral inductor 2. In addition, bumps 7 are formed on electrode pads 6 that are wired from the signal pickups 3, thereby constituting the chip 8. The material of the bumps 7 is Au or can be any solder material as long as similar characteristics suited to the object of the present invention are obtained.

FIG. 2 illustrates a constitution in which a chip 8, on which only the spiral inductor 2 shown in FIG. 1 is mounted, is flip-chip mounted in the package.

FIG. 2A is a planar view, FIG. 2B is a side cross-sectional view, and FIG. 2C is an enlarged view of a portion 18 of FIG. 2B. As shown in these figures, the chip 8 is mounted on the die-attach face 10 of a ceramic package 9 by means of a flip-chip construction method, and a package lid 91 covers and hermetically seals the ceramic package 9 via sealing material 92. The material of the ceramic package 9 may be any of alumina or LTCC (low temperature cofired ceramics).

The metal (conductor) pattern portion 9a and a non-conductor portion 9b are formed on the die-attach face 10 of the package 9. In addition, a gap 11 between the spiral inductor 2 and die-attach face 10 is 0.02 mm.

Figure 3C:
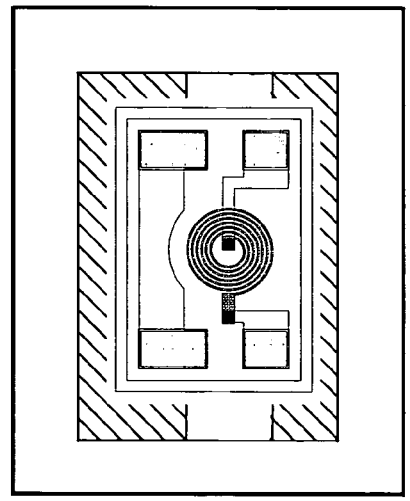
Figure 3A:
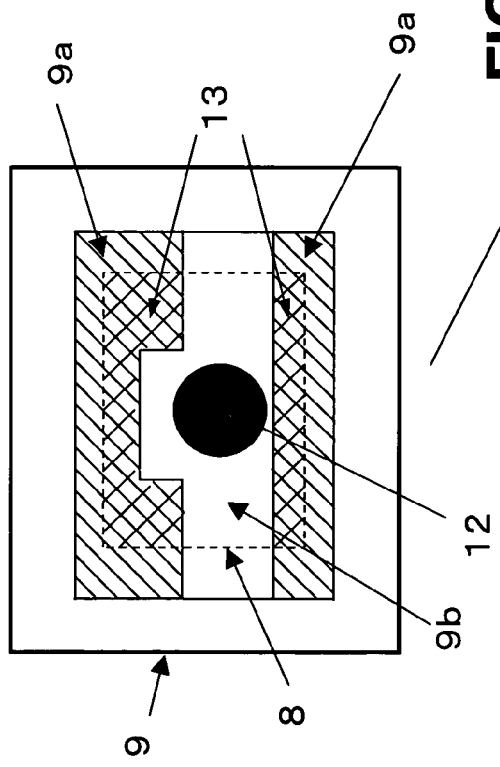

Further, FIG. 3 shows the face opposing the spiral inductor 2. As shown in FIG. 3A, the face 12 opposing the spiral inductor 2 is a region of the nonconductor part 9b where a metal pattern is not formed. The portion of the chip 8 excluding the region where the spiral inductor 2 is formed has a portion 13 that overlaps the metal pattern 9a.

FIG. 3B is a transparent view of the chip 8 in a state where the front and rear sides of the chip in FIG. 1A have been reversed. A state rendered by the superposition of FIGS. 3A and 3B is shown in FIG. 3C.

When a packaged inductance element was created as above and the inductance characteristic was measured, the inductance value was 7.6 nH and the performance index (Q value) was approximately 25.

Next, as a comparative example, the whole of the face opposing the spiral inductor 2 shown in FIG. 3A was formed as the metal pattern 9a and the influence on the Q value in the event of a variation in the distance between the spiral inductor 2 and the metal pattern 9a of the face opposing the spiral inductor was examined.

Figure 4:
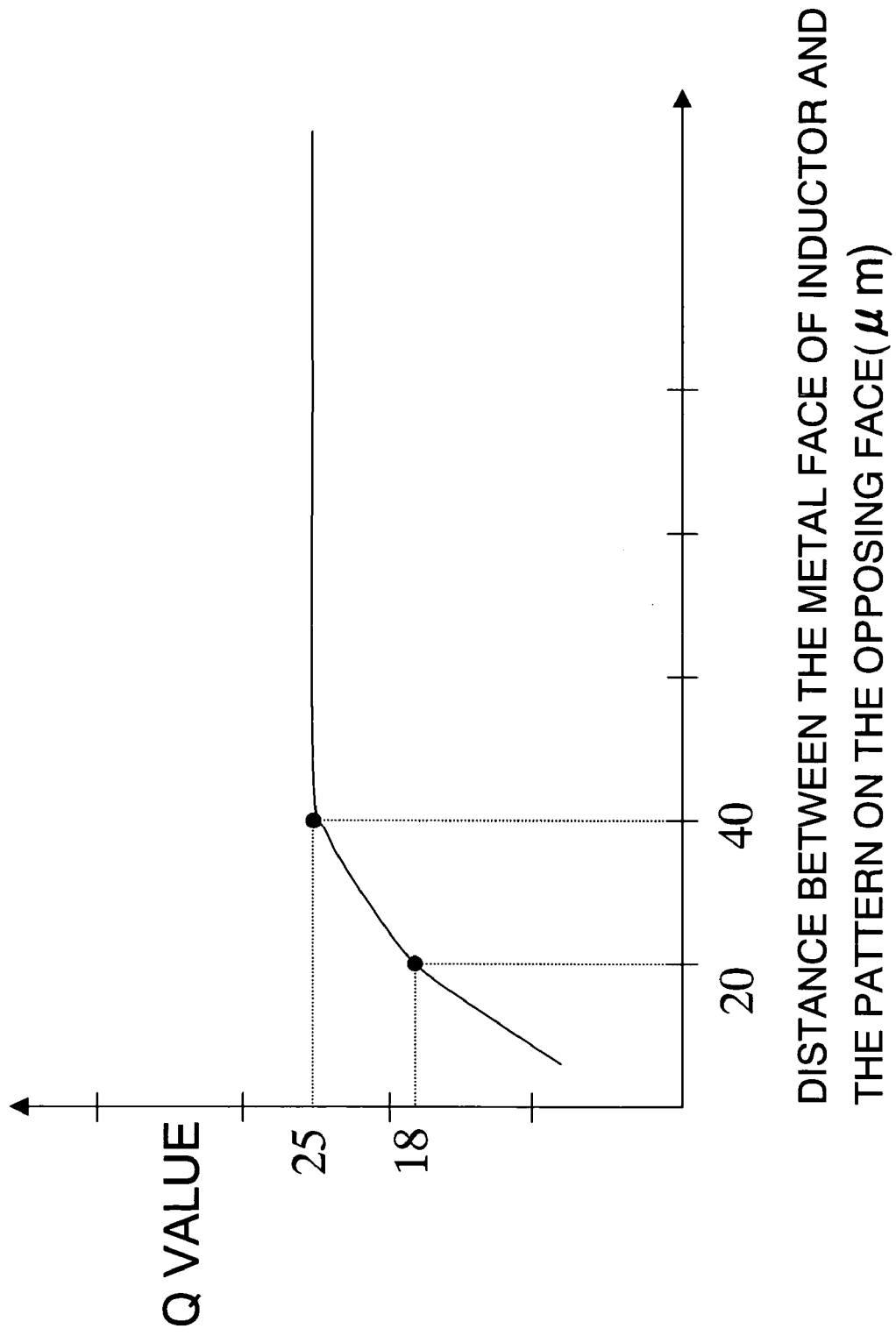
FIG. 4 is a graph showing the influence on the Q value of a variation in the distance between the spiral inductor 2 and a metal pattern 9a of the face opposing the spiral inductor.

FIG. 4 is a graph showing the influence on the Q value in the event of a variation in the distance between the spiral inductor 2 and the metal pattern 9a of the face opposing the spiral inductor in a state where there is a metal pattern 9a of a fixed area on the face opposing the spiral inductor 2 at a frequency of 880 MHz by means of an electromagnetic field simulation.

It can be seen, from the results of the electromagnetic field simulation in FIG. 4, that, in comparison with the constitution of FIG. 3A, the same Q value (=25) is obtained by separating the face opposing the spiral inductor 2 and the metal pattern 9a by a distance of 40 μm or more (therefore, four or more times the spiral inductor wire width).

Figure 5:
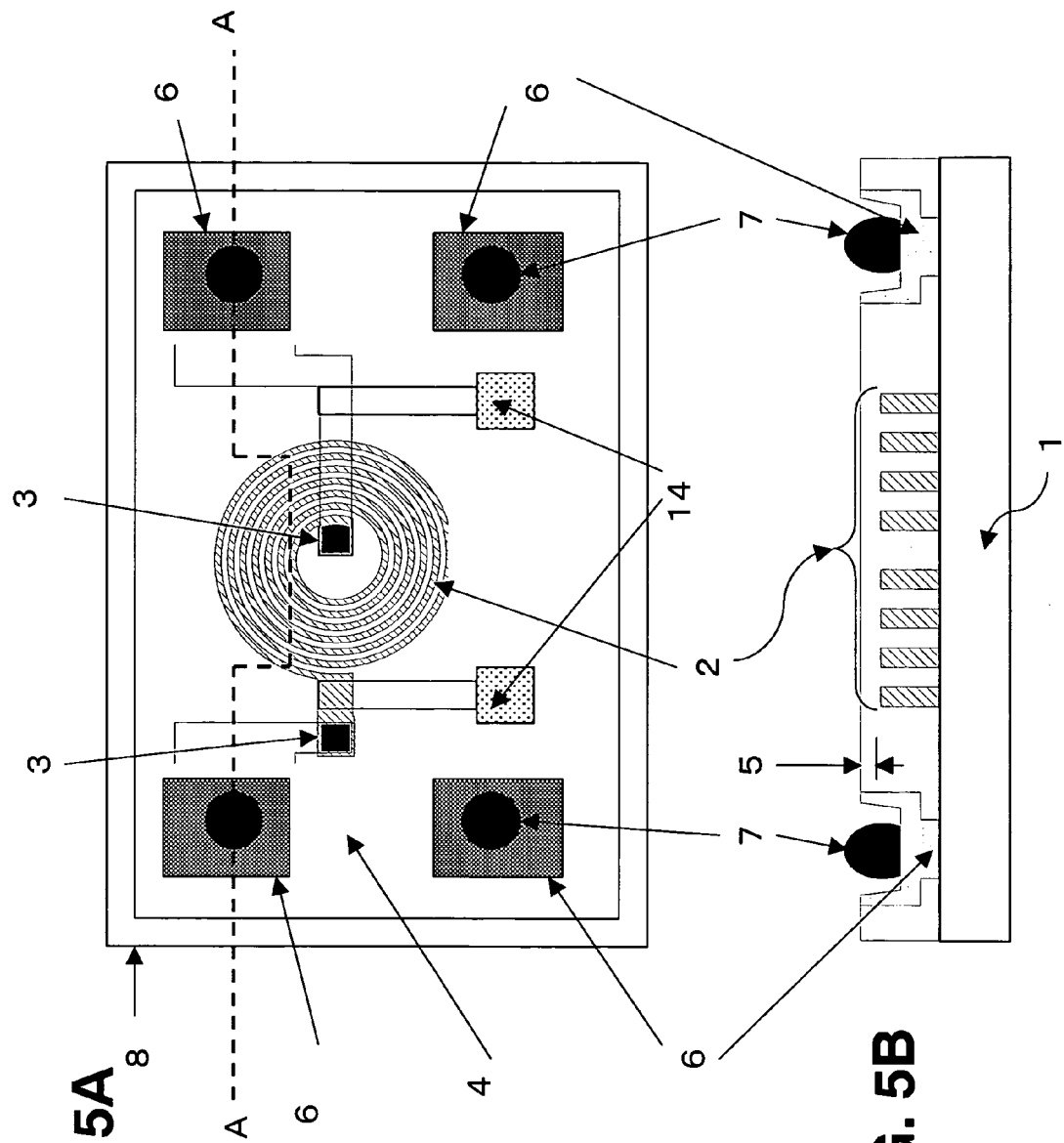
FIG. 5 shows a chip 8 in which capacitors are inserted in the chip constitution of FIG. 1 in parallel between the signal pickups 3 and spiral inductor 2.

Next, FIG. 5 shows a chip 8 in which capacitors are inserted in the chip constitution of FIG. 1 in parallel between the signal pickups 3 and spiral inductor 2. FIG. 5A is a planar view and FIG. 5B is a side cross-sectional view along the line A—A. That is, parallel plate capacitors 14 are formed between the signal pickups 3 and spiral inductor 2 such that the respective capacitances are 3.4 pF. The capacitors 14 are approximately 0.08 mm². A filter for an equivalence circuit is configured by means of this constitution. The remaining constitution is analogous to that of FIGS. 1 to 3.

With a filter of this constitution, when the insertion loss was measured, same had a minimum value of approximately −2.5 dB. Next, as a comparative example, when the chip 8 of FIG. 5 is hermetically sealed in the package 9, the metal pattern 9a is formed on the face opposing the spiral inductor 2 in order to generate an overlap in 40% of the area of the spiral inductor 2. The remaining constitution is analogous to that of FIGS. 1 to 3.

Further, likewise, by means of an electromagnetic simulation, the influence on filter insertion loss when the distance between the spiral inductor 2 and the metal pattern 9a of the face opposing the spiral inductor is changed at a frequency of 880 MHz was measured.

Figure 6:
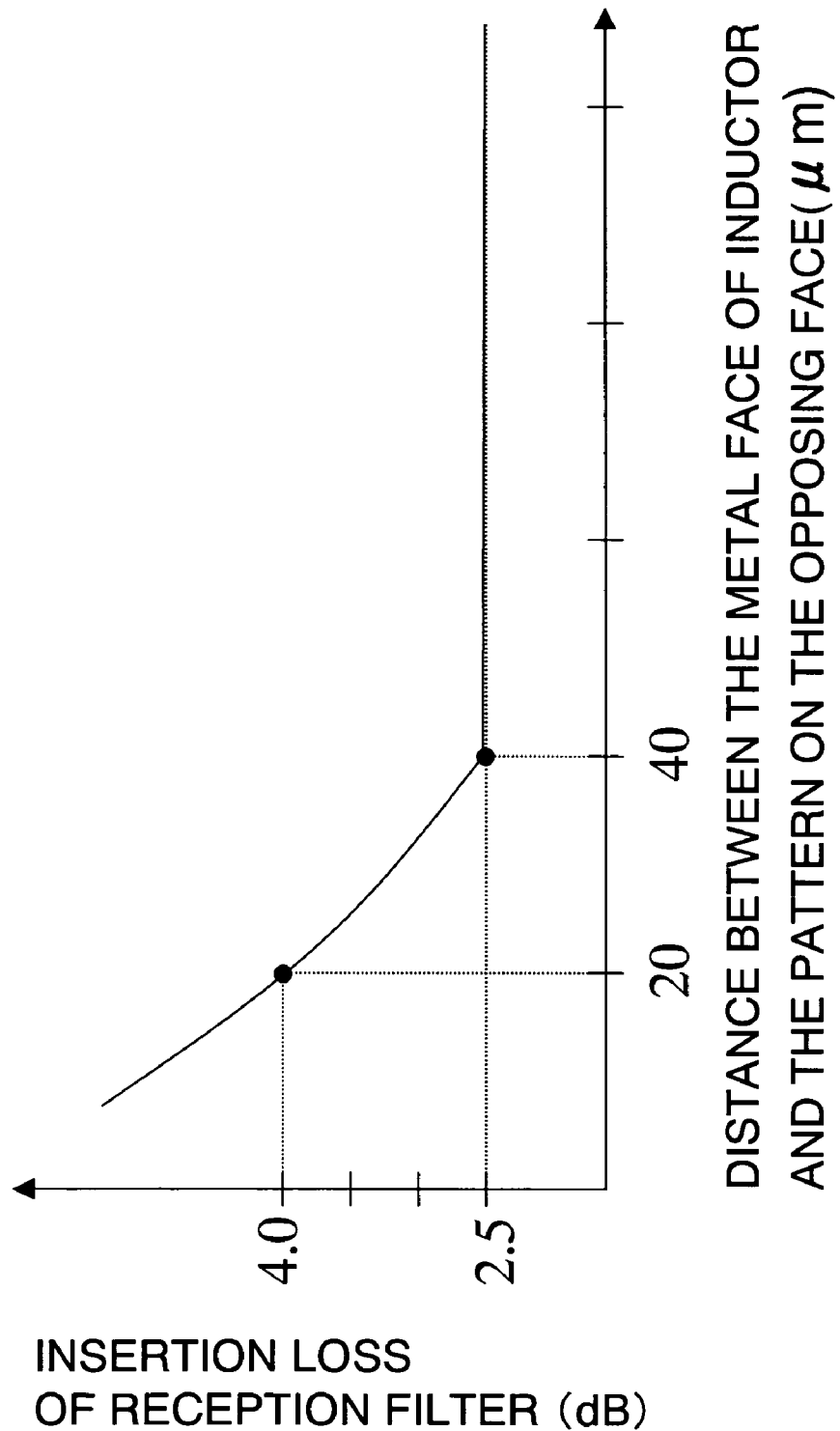
FIG. 6 is a graph showing simulation results that illustrates the relationship between the distance between the spiral inductor 2 and the metal pattern 9a of the face opposing the spiral inductor, and filter insertion loss.

FIG. 6 is a graph of simulation results that shows the relationship between the distance between the spiral inductor 2 and metal pattern 9a of the face opposing the spiral inductor, and filter insertion loss. It can be seen from FIG. 6 that the spiral inductor 2 and the metal pattern 9a of the face opposing the spiral inductor that overlaps a region of approximately 40% must be separated by a distance of 40 μm or more as per the earlier example (four times the wire width of the spiral inductor 2) to render the same insertion loss (−2.5 dB).

It can be seen from the above examination that, irrespective of the Q value of the spiral inductance or the filter insertion loss, in cases where the spiral inductor 2 is flip-mounted in the package, when there is an overlap with the metal pattern on the face opposing the spiral inductor, the influence can be avoided by retaining a gap that is four or more times the wire width of the spiral inductor.

Here, a splitter (duplexer) is assumed for an application example of a package in which a chip, in which the examined spiral inductor 2 is formed on an insulator substrate, is flip-chip mounted in accordance with the present invention.

FIG. 7 shows constitutional examples of a duplexer. The constitution shown in FIG. 7 comprises a reception surface acoustic wave (SAW) filter 21 that passes a reception signal that is received by a common antenna 24, and a transmission surface acoustic wave (SAW) filter 22 that passes a transmission signal that is supplied to the common antenna 24.

Figures 7A, 7B:
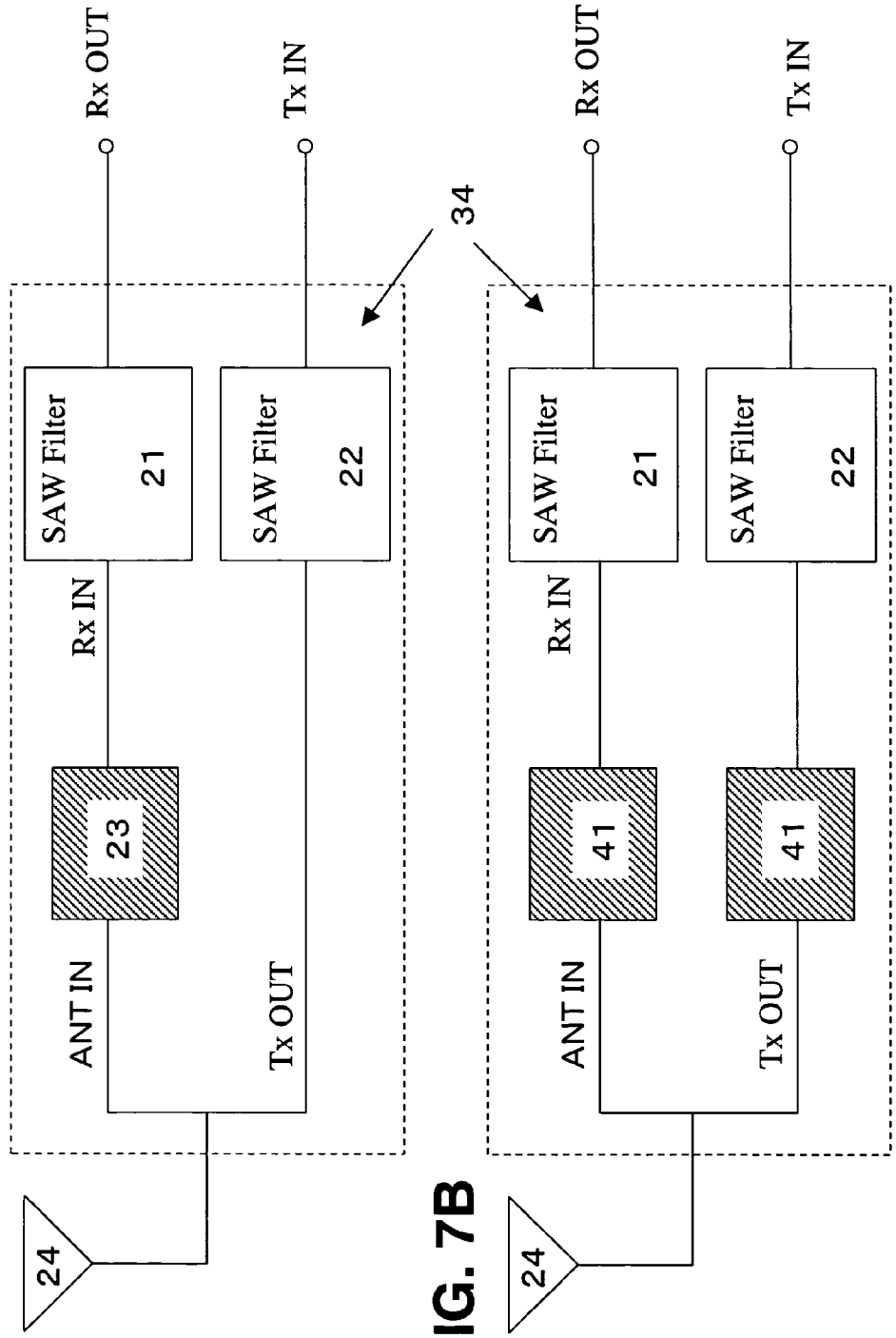
FIG. 7 shows constitutional examples of a duplexer.

In FIG. 7A, the phase shift circuit 23 is provided on the input side of the reception surface acoustic wave filter 21 so that the passband of the reception surface acoustic wave filter 21 is the blocked bandwidth of the transmission surface acoustic wave filter 22.

Meanwhile, in FIG. 7B, the maximum electrical power can be transmitted by matching the characteristic impedance of the common antenna 24 and transmission and reception surface acoustic wave filters 21 and 22 by means of each of the impedance matching circuits 41.

Figure 8:
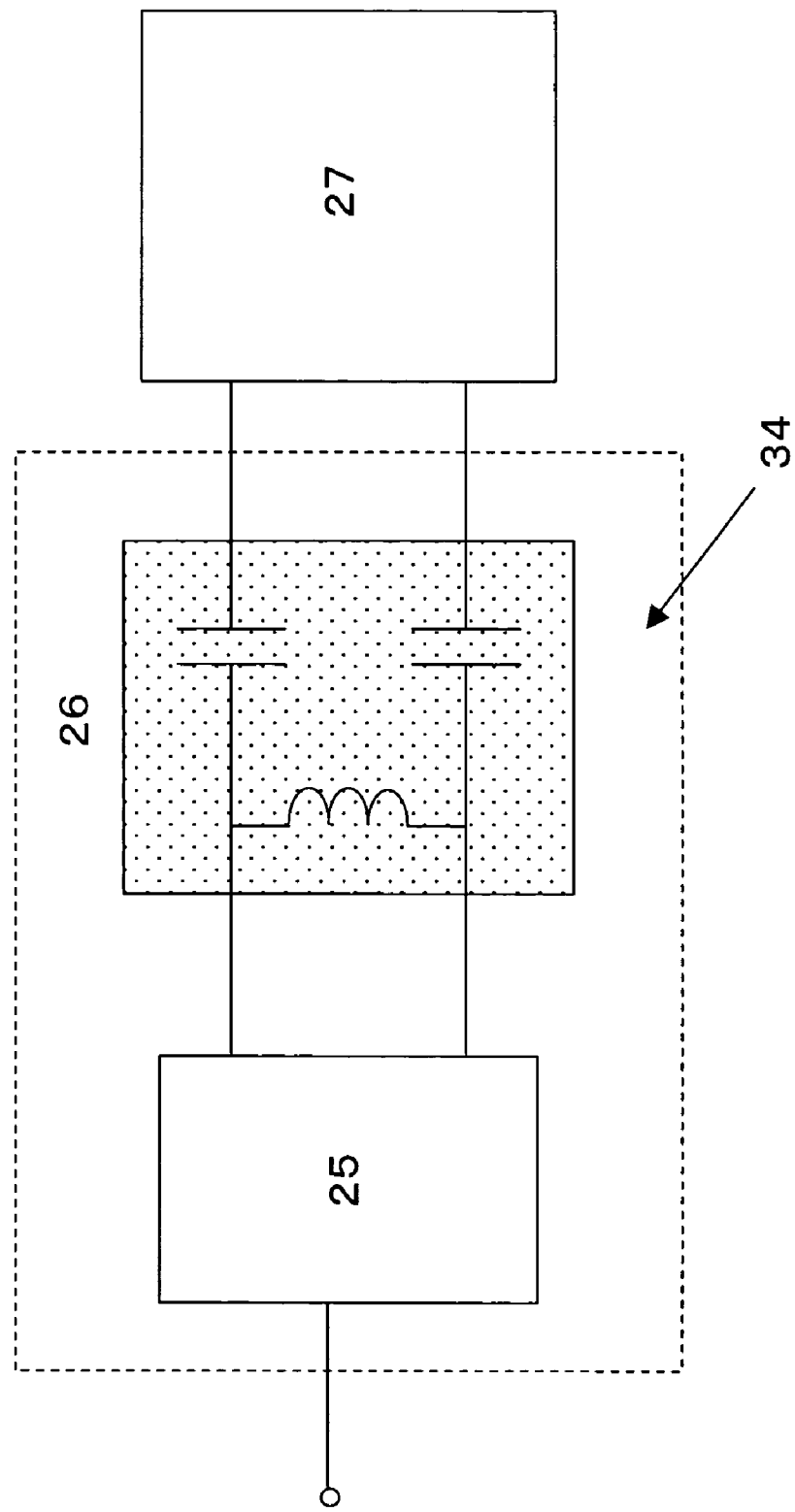
FIG. 8 shows a constitutional example of a typical reception balance filter.

In addition, the example shown in FIG. 8 shows a constitutional example of a typical reception balance filter. A reception signal that is received by an antenna (not shown) is inputted by a reception SAW filter 25 to a low noise amplifier 27 via a balance-type impedance-matching circuit 26.

In FIGS. 7 and 8 above, the phase shift circuit 23 and impedance matching-circuits 41 and 26 have a constitution in which inductance is included in the circuit. Therefore, when a constitution 34 comprising these circuits and a SAW filter is housed in a single hermetically sealed package, an application of the present invention according to the principles of the invention described earlier is feasible.

Figure 9A:
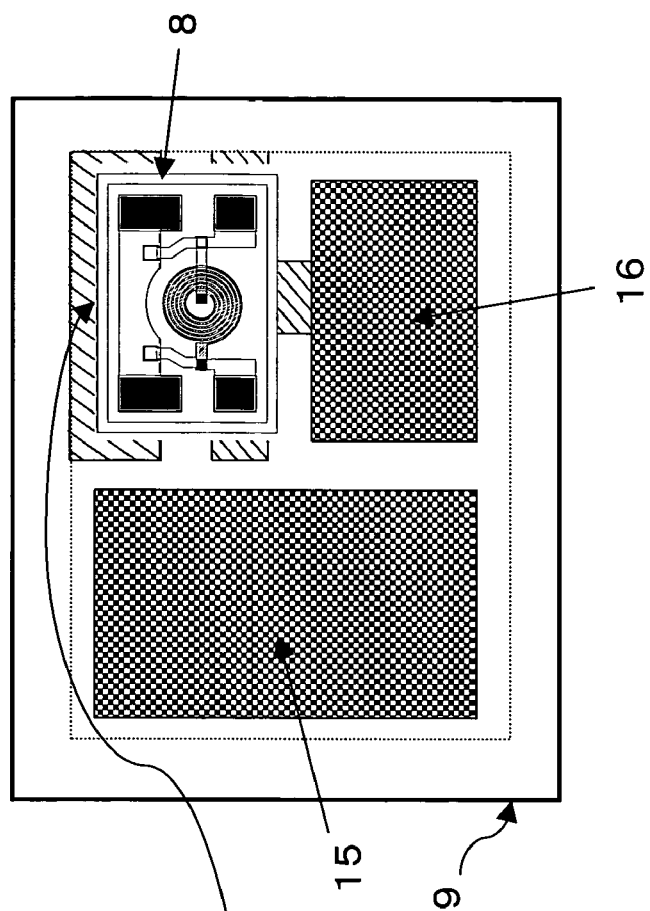
FIG. 9 shows an embodiment in which the present invention is applied to the phase shift circuit 23 shown in FIG. 7A.

FIG. 9 shows an embodiment in which the present invention is applied to the phase shift circuit 23 shown in FIG. 7A. FIG. 9A is a planar constitutional view of a chip that corresponds to the phase shift circuit shown in FIG. 5.

Figure 9B:
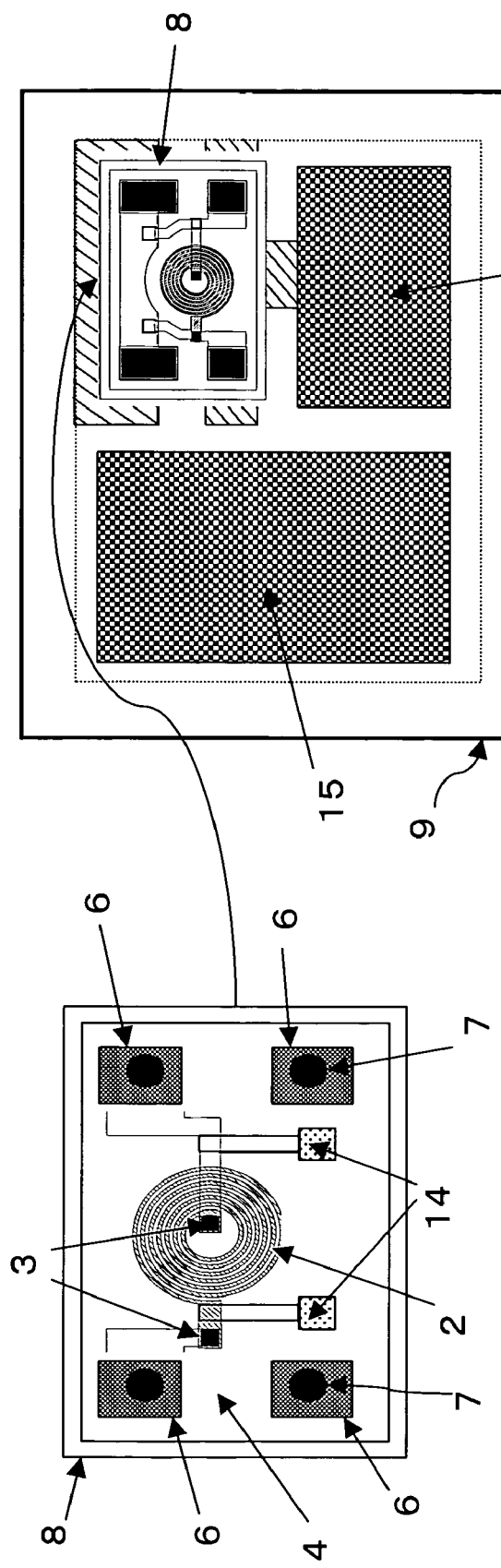

In FIG. 9B, the phase shift circuit 23 and the transmission and reception SAW filters 21 and 22 shown in FIG. 7A of a duplexer are made a single package constitution 34.

The transmission SAW filter 22 and the reception SAW filter 21 are disposed in the package 9 in respective regions 15 and 16. In addition, a chip 8, which constitutes the phase shift circuit 23, is mounted in the package 9 in accordance with the present invention. Each of the chips 8 constituting the transmission SAW filter 22, reception SAW filter 21, and phase-shift circuit 23 are mounted on the bottom face of the ceramic package 9 by means of the flip chip construction method.

Figure 10A:
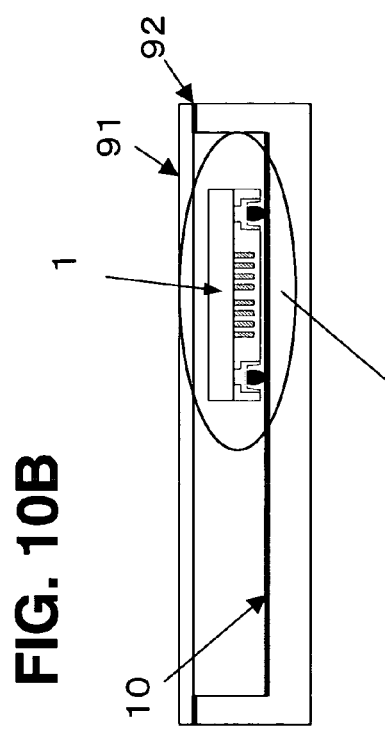
FIG. 10 illustrates the flip-chip mounting in the package 9 of only the chip 8 constituting the phase shift circuit 23 for the sake of simplification.
Figure 10B:
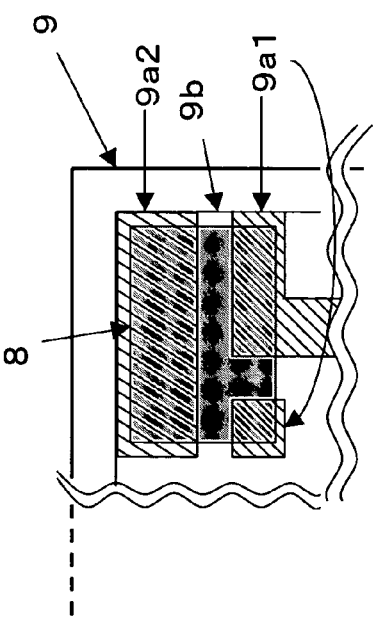

FIG. 10 illustrates the flip-chip mounting in the package 9 of only the chip 8 constituting the phase shift circuit 23 for the sake of simplification.

Figure 10C:
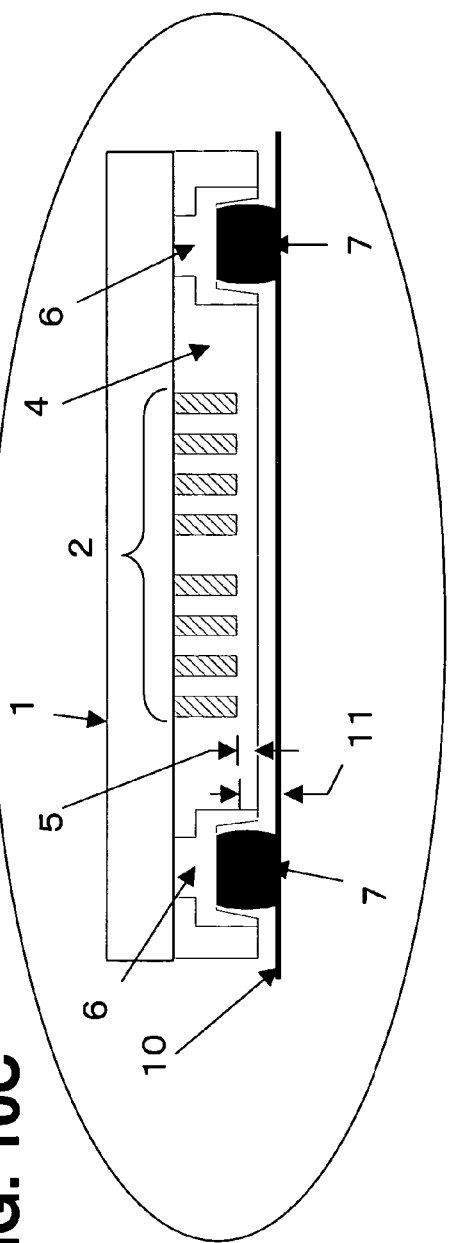

As shown in the planar view of FIG. 9A and the side cross-sectional view of FIG. 10C, the chip 8 constituting the phase shift circuit 23 forms the spiral inductor 2 on a glass substrate 1 by means of copper wiring with an internal diameter of 0.225 mm, a wire width of 0.01 mm, a wire gap of 0.01 mm and 4.5 turns, and signal pickups 3 are provided outside the spiral inductor 2 and at the center thereof respectively. In addition, parallel plate capacitors 14 are constituted so that the respective capacitances in parallel between the signal pickups 3 and spiral inductor 2 are 3.4 pF. The capacitors 14 are approximately 0.08 mm². The circumference of the spiral inductor 2 is buried in an insulator 4 with a relative permittivity of 2.8 and a cover 5 of 0.001 mm is provided at the top of the spiral inductor 2. Next, bumps 7 are formed on pads 6, which are wired from the signal pickups 3, to render a single chip 8.

The chip 8 constituting the phase shift circuit 23 is further mounted on the die-attach face 10 of the ceramic package 9 via the bumps 7 by means of the flip chip construction method. At such time, the gap 11 between the spiral inductor 2 and die-attach face 10 is 0.02 mm.

Figure 11:
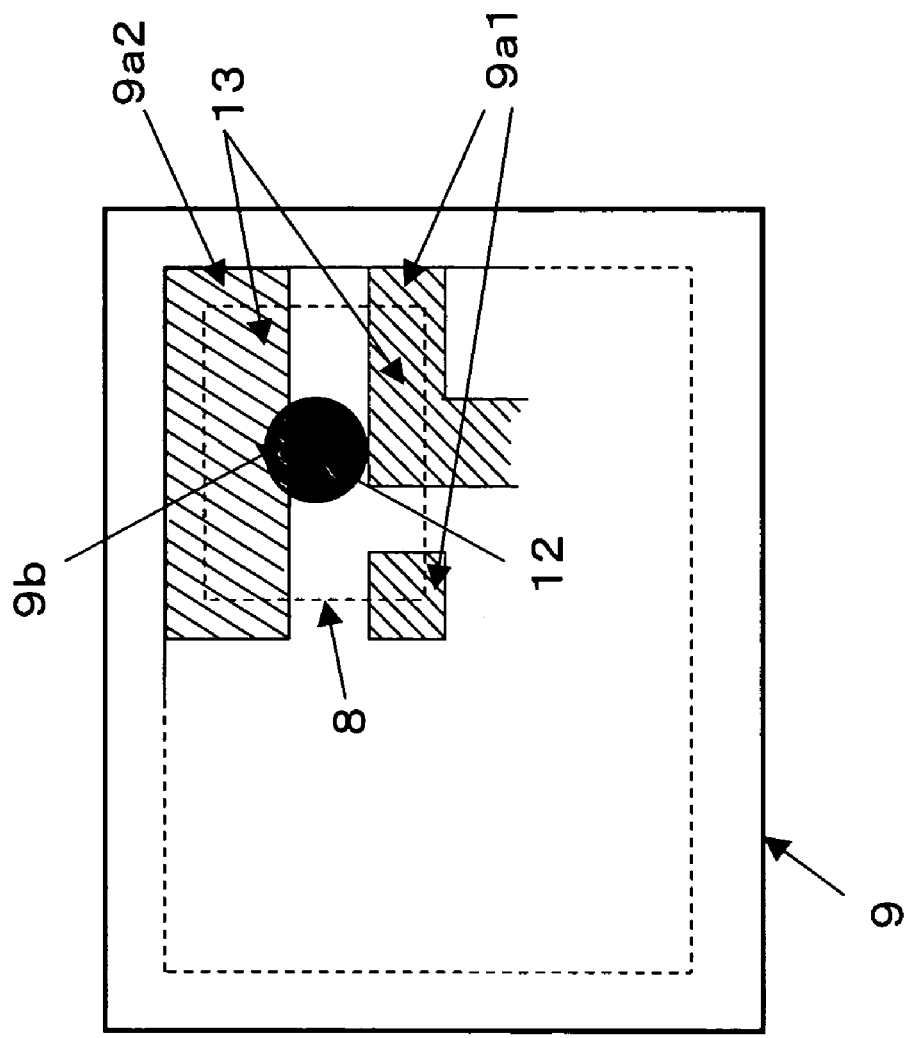
FIG. 11 illustrates metal patterns that exist on a die-attach surface 10 facing the chip 8.

Here, a metal (conductor) pattern for a connection with the antenna 24 and reception SAW filter 21 exists on the die-attach face 10 opposite the chip 8 that constitutes the phase shift circuit 23. FIG. 11 illustrates this state.

In FIG. 11, the metal (conductor) pattern 9a1, which connects to the antenna 24 and reception SAW filter 21, and the ground metal (conductor) pattern 9a2 exist in the region of the die-attach face 10 facing the chip 8 that constitutes the phase shift circuit 23.

Therefore, there are cases where the region opposite the spiral inductor 2 and the region of the metal (conductor) pattern 9a1 or the ground metal (conductor) pattern 9a2 overlap.

Figure 12:
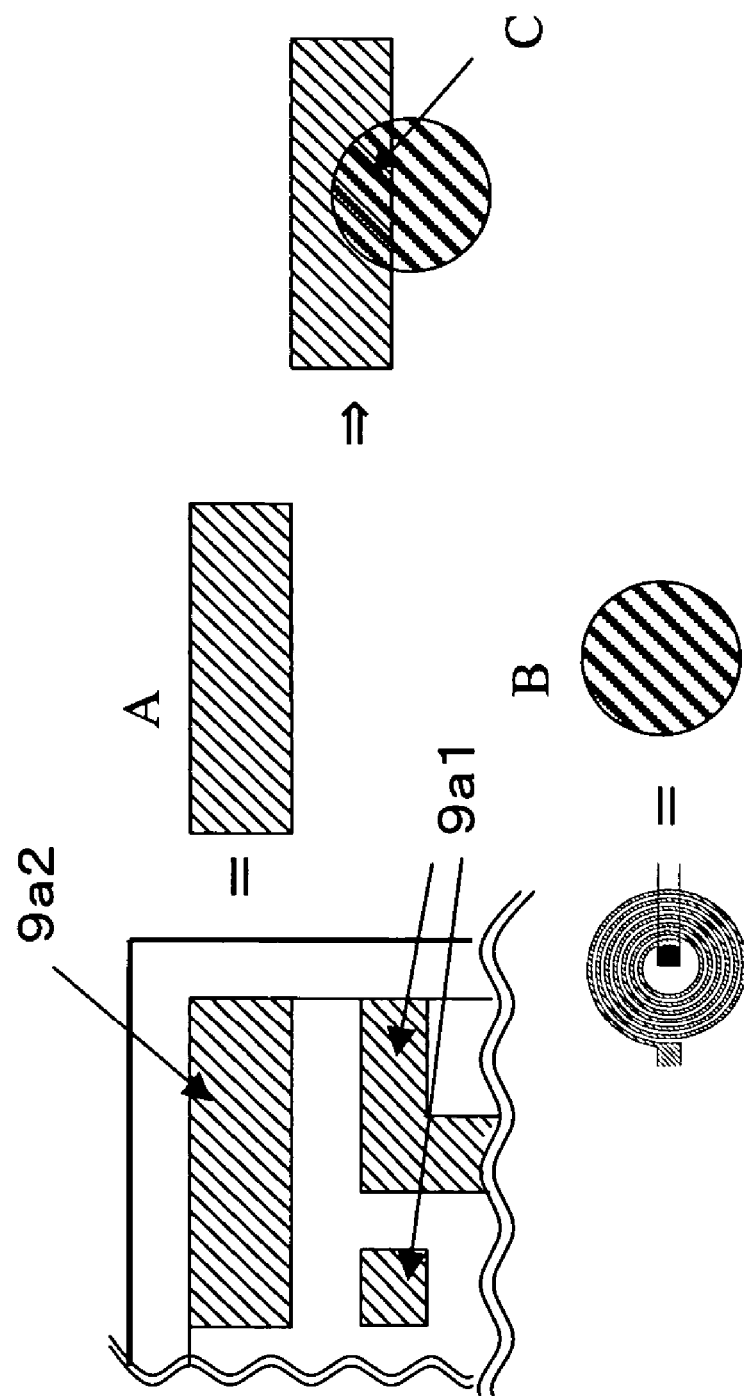
FIG. 12 illustrates a case where the region facing the spiral inductor 2 and the region of a ground metal (conductor) pattern 9a2 overlap.

FIG. 12 illustrates a case where the region opposite the spiral inductor 2 and the region of the ground metal (conductor) pattern 9a2 overlap. 'A' in FIG. 12 represents the ground metal (conductor) pattern 9a2 as a surface area, 'B' represents the surface area of the spiral inductor 2, and therefore 'C' shows the overlap of surface area A of the ground metal (conductor) pattern 9a2 and the surface area B of the spiral inductor 2. The amount of overlap between the two surface areas can be determined.

Here, as shown in FIG. 9, the spiral inductor 2 is flip-flop mounted in the ceramic package 9 together with the reception SAW filter 21 and transmission SAW filter 22 and then the package 9 is sealed to render a single product.

Figure 13:
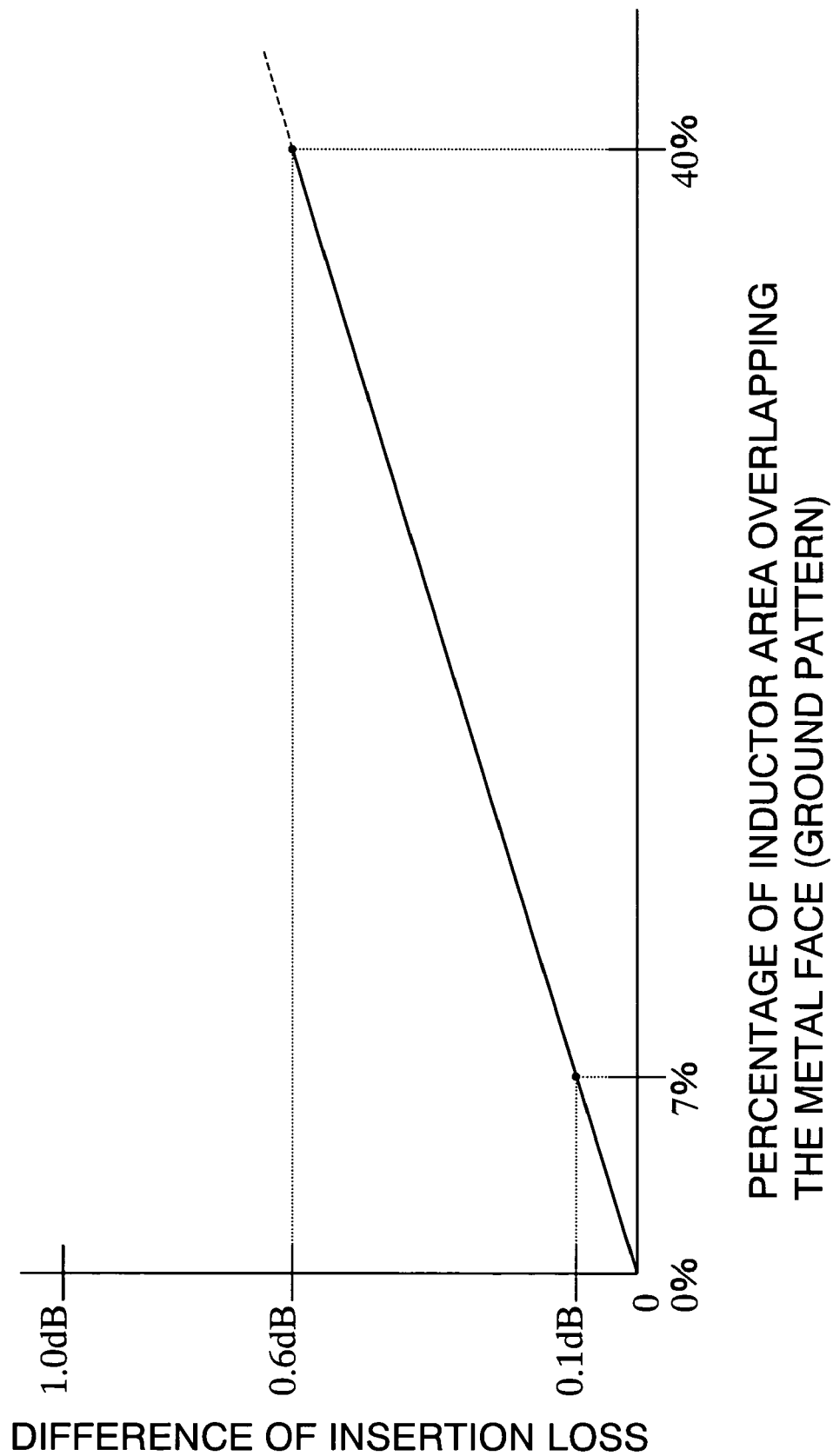
FIG. 13 shows the relationship between a variation in the area of the metal face (ground pattern) on the face opposing the spiral inductor 2 and the accompanying insertion loss.

The insertion loss of the reception SAW filter 21 and transmission SAW filter 22 of this product is measured and thus the relationship between the variation in the surface area of the metal face (ground pattern) on the face opposing the spiral inductor 2 and the accompanying insertion loss is determined. FIG. 13 is a graph illustrating this relationship. The horizontal axis represents the ratio of the area of overlap of the opposing ground pattern 9a2 in relation to the total area of the spiral inductor 2 as a percentage (A/B). The vertical axis represents the variation in the insertion loss (−2.5 dB) with respect to when the insertion loss is 0 in cases where there is no overlap between the spiral inductor 2 and ground pattern 9a2.

Based on the measurement results, the planar overlap between the ground pattern 9a2 on the die-attach face 10 and the spiral inductor 2 must be made 7% or less in order to make the insertion loss difference with respect to a case where there is absolutely no overlap 0.1 dB or less.

Figure 14:
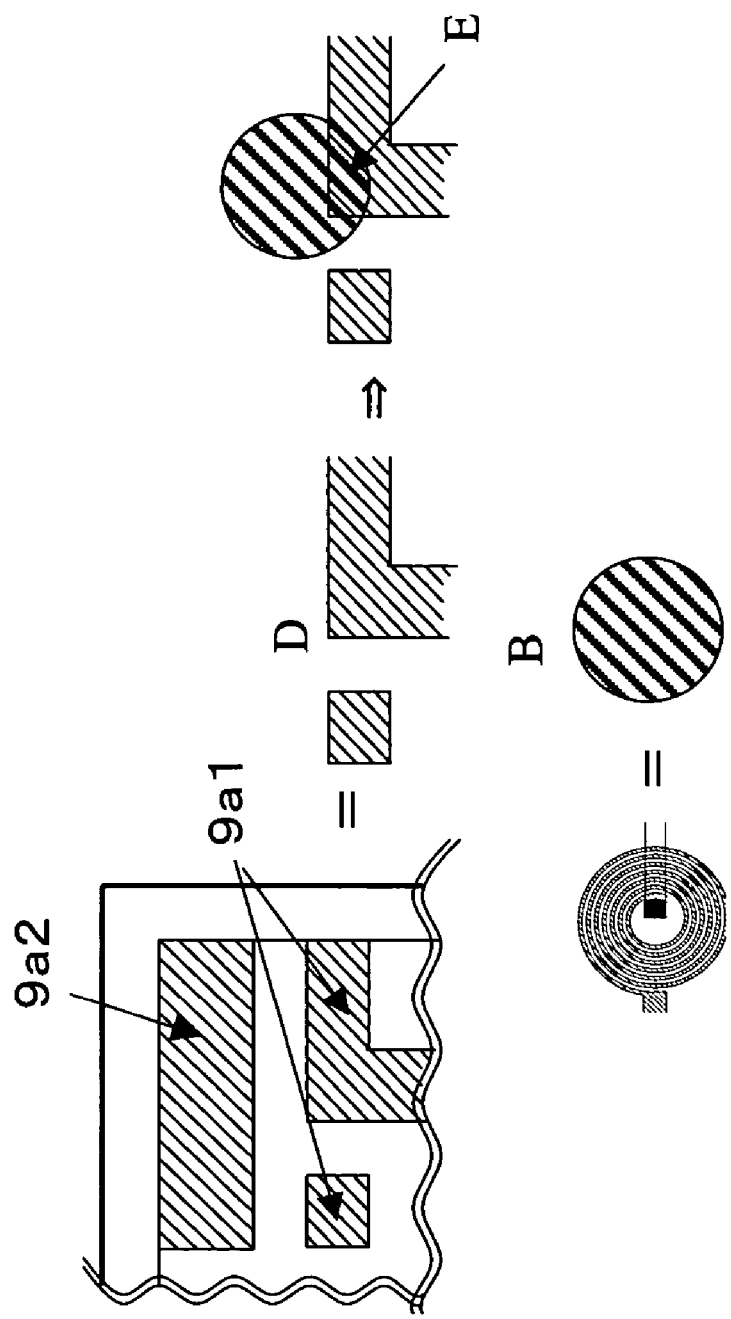
FIG. 14 illustrates a case where the region facing the spiral inductor 2 and the region of a signal metal pattern 9a1 overlap.

FIG. 14 illustrates a case where the overlap of the spiral inductor 2 is not with the ground pattern 9a2 but instead with the signal pattern 9a1. In FIG. 14, 'D' represents the surface area of the signal pattern 9a1 and 'E' denotes the overlap between the spiral inductor 2 and the area of the signal pattern 9a1.

Figure 15:
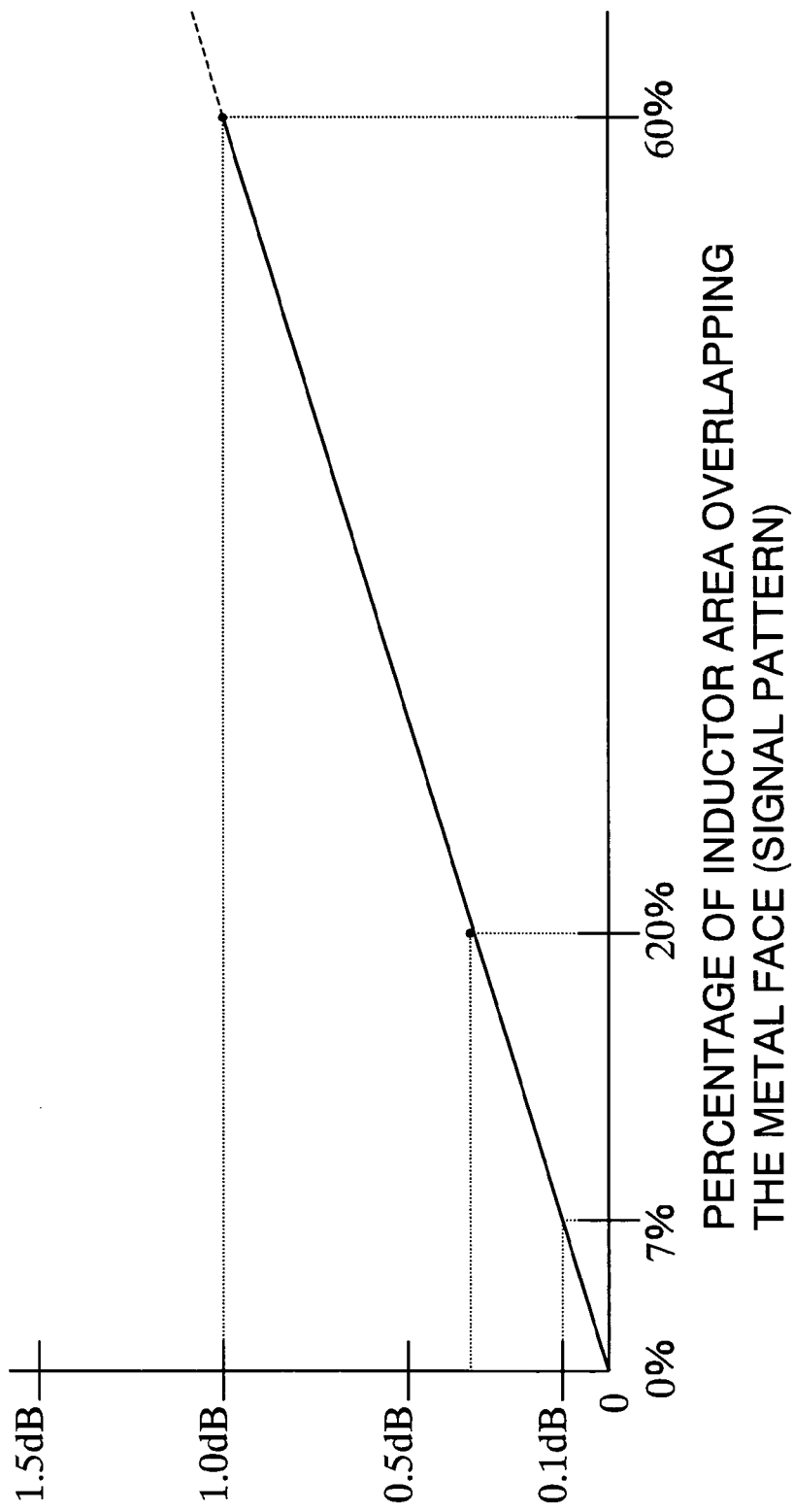
FIG. 15 illustrates the relationship between a variation in the area of the signal pattern 9a1 on the face opposing the spiral inductor 2 and the insertion loss of the reception SAW filter 21 and transmission SAW filter 22.

The insertion loss of the reception SAW filter 21 and transmission SAW filter 22 is measured and FIG. 15 shows the relationship between the variation in the surface area of the metal face (signal pattern 9a1) on the face opposing the spiral inductor 2 and the accompanying insertion loss. Here, as per FIG. 13, the horizontal axis represents the ratio (E/B) of the area of overlap of the opposing signal pattern 9a1 in relation to the total area of spiral inductor 2 as a percentage. The vertical axis represents the variation in the insertion loss (−2.5 dB) with respect to when the insertion loss is 0 in cases where there is no overlap between the spiral inductor 2 and signal pattern 9a1.

Based on the measurement results, it can be seen that, with respect to the overlap with the signal pattern 9a1, the planar overlap between the ground pattern 9a2 on the die-attach face 10 and the spiral inductor 2 must be made 7% or less as per the ground pattern overlap in order to make the preferred insertion loss difference 0.1 dB or less.

Figures 16A, 16B:
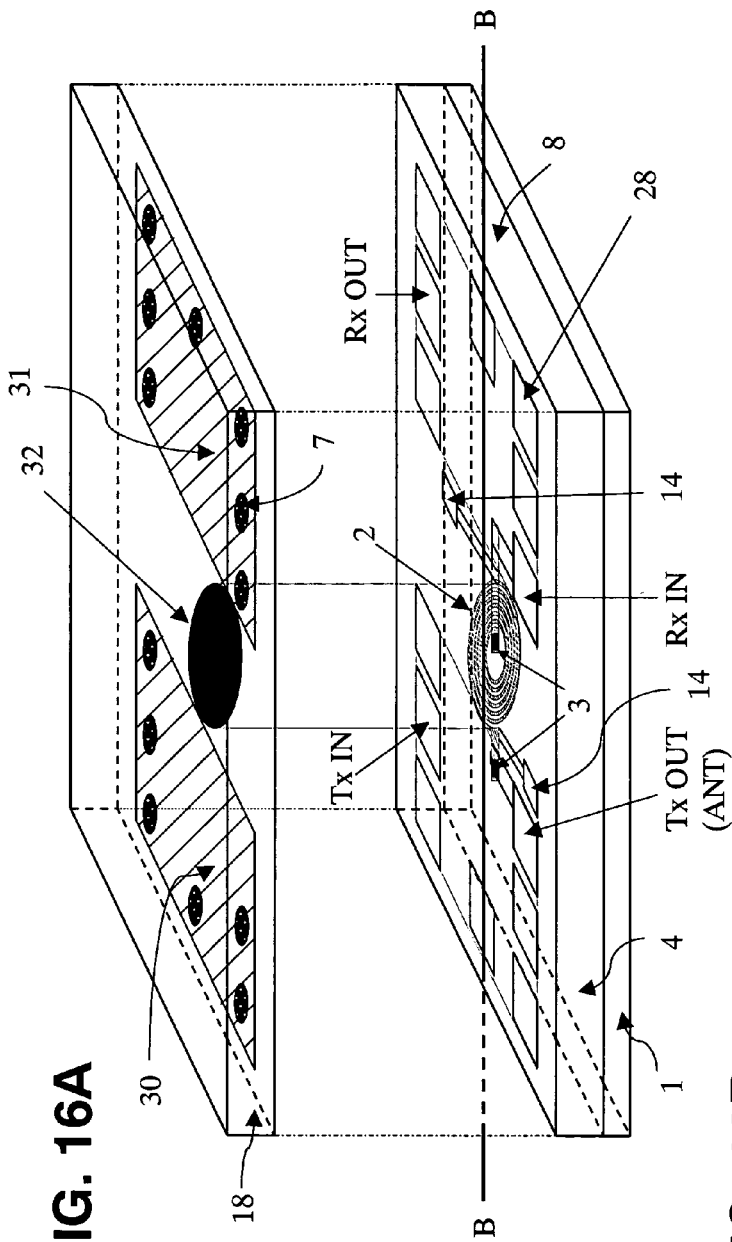
FIG. 16 shows an example of a constitution in which only the transmission and reception SAW filters are flip-chip mounted, which represents a structure to facilitate fabrication according to the present invention.

The above embodiment was a constitution in which the spiral inductor 2 was mounted in the package together with the transmission SAW filter 21 and reception SAW filter 22 likewise by means of flip-chip mounting and then the lid 91 was hermetically sealed. Meanwhile, FIG. 16 is another embodiment according to the present invention, which is an example of a constitution in which only the transmission and reception SAW filters are flip-chip mounted and which especially facilitates fabrication and represents a structure that further enables miniaturization. FIG. 16A is a perspective view in which a twin-layer structure is split into upper and lower layers to facilitate comprehension. FIG. 16B is a side cross-sectional view along the line B—B of the lower layer in FIG. 16A.

In FIG. 16, the spiral inductor 2 is formed in the center of an insulator substrate 1 by means of copper wiring that has an internal diameter of 0.225 mm, a wire width of 0.01 mm, a wire gap of 0.01 mm and 4.5 turns, and signal pickups 3 are provided outside the spiral inductor 2 and at the center thereof respectively, whereby a chip 8 of lower-layer is constituted.

Parallel plate capacitors 14 are formed in parallel between the signal pickups 3 and spiral inductor 2 so that the respective capacitances are 3.4 pF. The capacitors 14 are approximately 0.08 mm$^2$. The circumference of the spiral inductor 2 is buried in an insulator 4 with a relative permittivity of 2.8 and a cover 5 of 0.001 mm is provided at the top of the spiral inductor 2. In addition, pads 28 are constituted at the circumference of the spiral inductor 2 and through-holes 29 are formed for through wiring. As a result, a chip 8 having the spiral inductor 2, which is to become the lower layer, is constituted.

Meanwhile, a plurality of bumps 7 is formed on a single chip 18 formed with transmission and reception SAW filter (transmission filter 30 and reception filter 31) patterns and mounted on a chip, whose lower layer constitutes an inductor and capacitor, to face the chip 18 by means of the flip chip construction method.

After mounting, the peripheral edge of the chip is rendered a hermetic structure by means of metal 33. At such time, the gap 40 between the pattern face of the spiral inductor 2 and the face opposing the spiral inductor is approximately 20 μm and the face 32 opposing the spiral inductor 2 is in a state where a metal pattern is not present. In this case, the face 32 opposing the spiral inductor 2 is a region without a metal pattern and hence the size of the gap 40 need not be four or more times that of the wire width (0.01 mm) of the spiral inductor 2.

Here, in the above description of the embodiments, the shape of the spiral inductor 2 is shown as an entirely circular spiral. However, the application of the present invention is not limited to such a case. FIG. 17 shows other spiral shapes that may substitute the circular spiral (FIG. 17A).

Figure 17C:
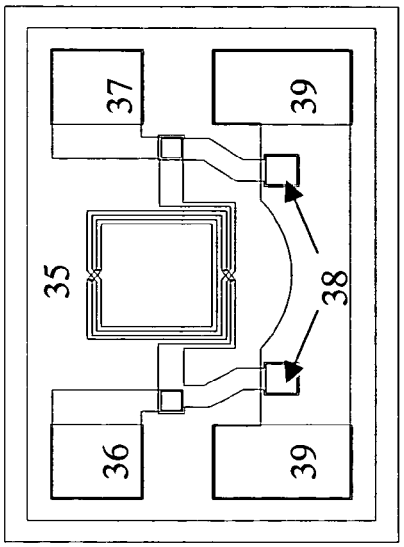
FIG. 17 shows shapes of other spirals that may replace the circular spiral.
Figure 17F:
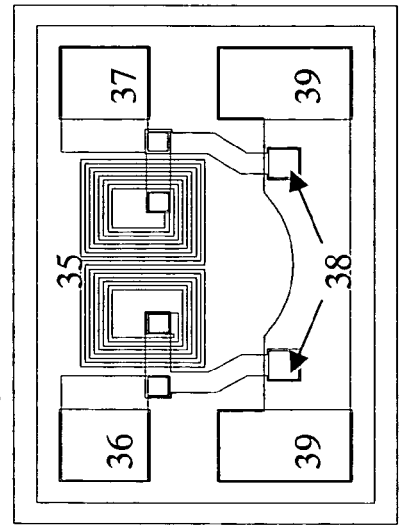
Figure 17B:
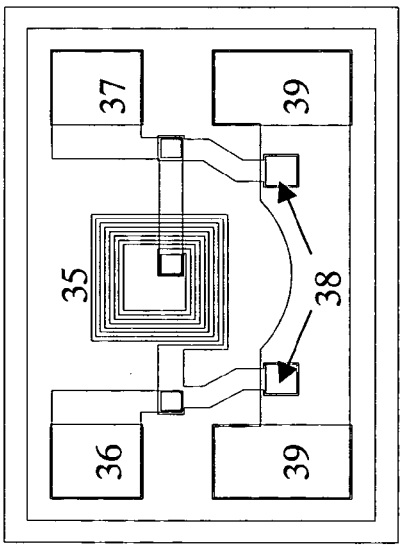
Figure 17E:
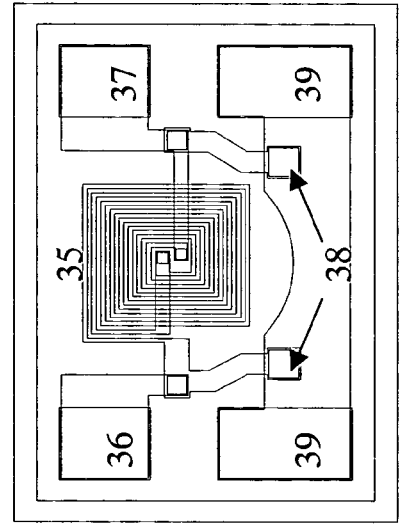

FIG. 17B shows a square spiral; FIG. 17C shows a spiral whose loop surface area is equal; FIG. 17D shows a meander-type spiral; FIG. 19E shows an intertwined spiral; and FIG. 17F shows a twin spiral.

Figure 17A:
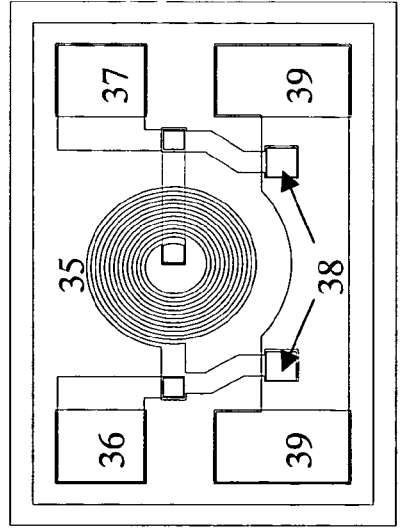
Figure 17D:
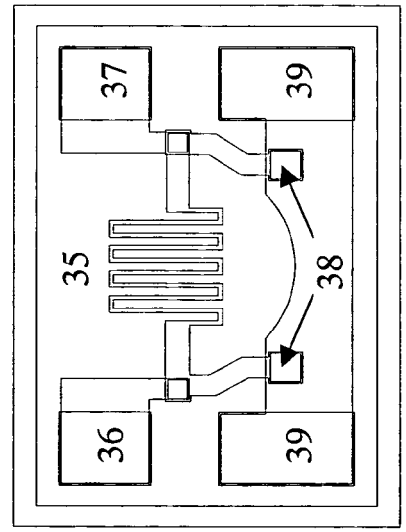

Although a spiral inductor 2 with the circular layout of FIG. 17A was employed in the description of the embodiments of the present invention, the effect of the present invention may also be obtained by means of a spiral inductor with any of the layouts shown in FIG. 17.

Moreover, a resistor part can be formed in series with or in parallel with the inductor part of the chip where the spiral inductor of the present invention is formed and countermeasures to alleviate damage caused by ESD (electrostatic discharge) of the surface acoustic wave device chip can also be taken.

INDUSTRIAL APPLICABILITY

As a result of the application of the present invention as described hereinabove with reference to the drawings, it is possible to provide a surface acoustic wave device with a shortened hermetic structure with improved insertion loss and for which there is no characteristic deterioration, which makes a substantial contribution to miniaturization of devices in which a surface acoustic wave device is mounted.

What is claimed is:

1. A surface acoustic wave device having a chip on which a spiral inductor is formed,
    wherein the chip on which the spiral inductor is formed is flip-chip mounted in a package together with another surface acoustic wave device chip;
    the package is provided with a hermetically sealed lid;
    a conductor pattern is formed on a face of the package that opposes the spiral inductor; and
    the overlap between the region of the spiral inductor and the conductor pattern is 7% or less.

2. A surface acoustic wave device having a chip on which a spiral inductor is formed,
    wherein the chip on which the spiral inductor is formed is flip-chip mounted in a package together with another surface acoustic wave device chip;
    the package is provided with a hermetically sealed lid;
    a conductor pattern is formed on a face of the package that opposes the spiral inductor; and
    the gap between the spiral inductor and the conductor pattern is at least four or more times the wire width of the spiral inductor.

3. The surface acoustic wave device according to claim 1 or 2, wherein the surface acoustic wave device chip comprises two surface acoustic wave elements, one of which is a reception surface acoustic wave filter that passes a reception signal that is received from a common antenna, and the other is a transmission surface acoustic wave filter that passes a transmission signal that is supplied to the common antenna; and
    the chip on which the spiral inductor is formed has a capacitor formed in parallel with the spiral inductor and possesses the function of a phase shift circuit or impedance matching circuit connected to the input side of the reception surface acoustic wave filter.

4. The surface acoustic wave device according to claim 3, wherein the conductor pattern on the face opposing the spiral inductor is a conductor for a connection with the reception surface acoustic wave filter, and a ground conductor.

5. A surface acoustic wave device having a chip on which a spiral inductor is formed, comprising:
    a first chip in which the spiral inductor is formed on an insulator substrate; and
    a second chip on which a surface acoustic wave element is formed,
    wherein the second chip is flip-chip mounted on the first chip so that the spiral inductor and the surface acoustic wave element lie opposite each other;
    the edges of the first chip and second chip are sealed by means of a hermetic structure; and
    the region of the spiral inductor and the region of the opposing surface acoustic wave element are formed without overlap.

6. The surface acoustic wave device according to claim 5, wherein the second chip comprises two surface acoustic wave elements, one of which is a reception surface acoustic wave filter that passes a reception signal that is received from a common antenna, and the other is a transmission surface acoustic wave filter that passes a transmission signal that is supplied to the common antenna; and
    the chip on which the spiral inductor is formed has a capacitor formed in parallel with the spiral inductor and possesses the function of a phase shift circuit or impedance matching circuit connected to the input side of the reception surface acoustic wave filter.

* * * * *